(12) United States Patent
Branstetter et al.

(10) Patent No.: US 9,506,957 B1
(45) Date of Patent: Nov. 29, 2016

(54) FLOATING APPARATUS FOR ALERTING PEOPLE OF THE PRESENCE OF VOLTAGE IN WATER

(71) Applicants: Aaron Neal Branstetter, New Albany, IN (US); Brian Byrd, New Albany, IN (US)

(72) Inventors: Aaron Neal Branstetter, New Albany, IN (US); Brian Byrd, New Albany, IN (US)

( * ) Notice: Subject to any disclaimer, the term of this patent is extended or adjusted under 35 U.S.C. 154(b) by 66 days.

(21) Appl. No.: 14/686,437

(22) Filed: Apr. 14, 2015

Related U.S. Application Data

(60) Provisional application No. 62/033,518, filed on Aug. 5, 2014.

(51) Int. Cl.
*G01R 19/165* (2006.01)
*G01R 1/04* (2006.01)

(52) U.S. Cl.
CPC ........... *G01R 19/16533* (2013.01); *G01R 1/04* (2013.01)

(58) Field of Classification Search
CPC combination set(s) only.
See application file for complete search history.

(56) References Cited

U.S. PATENT DOCUMENTS

| | | |
|---|---|---|
| 3,784,903 A | 1/1974 | Thomas |
| 3,869,668 A | 3/1975 | Thompson |
| 4,101,827 A | 7/1978 | Offner |
| 4,797,661 A | 1/1989 | Wiley |
| 4,910,498 A | 3/1990 | Feher |
| 5,005,007 A | 4/1991 | Weng et al. |
| 5,012,457 A | 4/1991 | Mitchell et al. |
| 5,107,447 A | 4/1992 | Ozawa et al. |
| 5,121,104 A | 6/1992 | Nelson et al. |
| 5,195,060 A | 3/1993 | Roll |
| 5,315,232 A | 5/1994 | Stewart |
| 5,614,889 A | 3/1997 | Kim |
| 5,886,630 A | 3/1999 | Menoud |
| 6,064,309 A | 5/2000 | Sellers et al. |
| 6,157,303 A | 12/2000 | Bodie et al. |
| 6,253,121 B1 | 6/2001 | Cline et al. |
| 6,370,945 B2 | 4/2002 | Roberts |
| 6,629,021 B2 | 9/2003 | Cline et al. |
| 7,019,649 B2 | 3/2006 | Hoenig |
| 7,170,416 B2 | 1/2007 | Philippe et al. |

(Continued)

FOREIGN PATENT DOCUMENTS

| | | |
|---|---|---|
| EP | 2189797 A2 | 5/2010 |
| ES | 2154213 A1 | 3/2001 |

(Continued)

OTHER PUBLICATIONS

Fish et al. "Conduction of Electrical Current to and Through the Human Body: A Review." ePlasty: Open Access Journal of Plastic Surgery 9 (2009). pp. 407-421.

(Continued)

*Primary Examiner* — Clayton E Laballe
*Assistant Examiner* — Jas Sanghera
(74) *Attorney, Agent, or Firm* — Middleton Reutlinger; Robert Eichenberger; Scott Higdon

(57) ABSTRACT

A floating apparatus for alerting people of the presence of voltage in water. When the floating apparatus is placed in water and in an active state, it detects when at least a threshold level of voltage is present in the water and generates an alert signal in response to detecting the threshold level of voltage is present. The floating apparatus may detect the threshold level of voltage is present without requiring that a ground wire be connected between an electrical circuit of the floating apparatus and a fixed structure exterior of the water such as soil surrounding the water.

20 Claims, 6 Drawing Sheets

(56) References Cited

U.S. PATENT DOCUMENTS

| | | |
|---|---|---|
| 7,248,054 B2 | 7/2007 | Kalokitis et al. |
| 7,327,275 B2 | 2/2008 | Brochu et al. |
| 7,405,670 B2 | 7/2008 | Fitzgerald |
| 8,339,270 B2 | 12/2012 | Silverman et al. |
| 8,442,660 B2 | 5/2013 | Kagan |
| 8,482,273 B2 | 7/2013 | Kalokitis et al. |
| 8,575,942 B2 | 11/2013 | Dorr et al. |
| 8,599,031 B2 | 12/2013 | Gelbien et al. |
| 8,643,360 B1 | 2/2014 | Cargill, III |
| 8,686,713 B2 | 4/2014 | Cargill, III |
| 8,887,556 B2 | 11/2014 | Silveri |
| 9,146,331 B2 | 9/2015 | Saether |
| 9,285,396 B2 | 3/2016 | King, Jr. et al. |
| 2008/0024265 A1 | 1/2008 | Jones |
| 2008/0106422 A1 | 5/2008 | Sparks et al. |
| 2008/0266118 A1 | 10/2008 | Pierson et al. |
| 2010/0176956 A1 | 7/2010 | Moerschell |
| 2013/0042516 A1 | 2/2013 | Lehman |
| 2013/0073239 A1 | 3/2013 | Edmondson |
| 2015/0198548 A1 | 7/2015 | Fournier et al. |

FOREIGN PATENT DOCUMENTS

| | | |
|---|---|---|
| WO | 02097758 | 12/2002 |
| WO | 2010078617 | 7/2010 |
| WO | 2014035459 | 3/2014 |

OTHER PUBLICATIONS

Shafer, et al. "USCG FY2006 Grant, In-Water Shock Hazard Mitigation Strategies, Final Report Oct. 1, 2008." Produced under a grant from the Sport Fish Restoration and Boating Trust Fund, administered by the U.S. Coast Guard. 161 pages.

FLOATING APPARATUS FOR ALERTING PEOPLE OF THE PRESENCE OF VOLTAGE IN WATER

CROSS REFERENCE TO RELATED APPLICATIONS

This application claims the benefit of provisional application Ser. No. 62/033,518, filed Aug. 5, 2014, the disclosure of which is hereby incorporated by reference in its entirety.

BACKGROUND

Voltage may be introduced into a body of water as a result of negligence, wear and tear of electrical components, improper installation of electrical components, and/or other factors. For example, voltage may be introduced into a pool as a result of a malfunctioning or improperly installed pool light, pump, and/or other pool apparatus. Also, for example, voltage may be introduced into an area of a lake near a dock due to a frayed portion of an extension cord contacting the water, wear and tear to an electrical system of the dock, etc.

Unfortunately, a source of voltage may be hidden, or not readily apparent, to people that may swim in or otherwise come in to contact with water having unsafe levels of voltage. Exposure of a human to an unsafe level of voltage in water can be harmful to the human when the human swims in or otherwise contacts the water. In many situations, exposure to an unsafe level of voltage in water may even lead to death—either as a direct result of exposure to the voltage or as an indirect result of drowning due to exposure to the voltage.

SUMMARY

This specification is directed generally to a floating apparatus for alerting people of the presence of voltage in water. When the floating apparatus is placed in water and in an active state, it detects when at least a threshold level of voltage is present in the water and generates an alert signal in response to detecting the threshold level of voltage is present. The floating apparatus may detect the threshold level of voltage is present without requiring that a ground wire be connected between an electrical circuit of the floating apparatus and a fixed structure exterior of the water such as soil surrounding the water.

The floating apparatus may comprise a first conductive material and a second conductive material that are enclosed in a housing and electrically coupled in series with one another and electrically coupled to, and providing input to, an electrical input of a capacitive voltage detection circuit. The floating apparatus may be configured so that, when it is placed in water, the first conductive material is surrounded by the water and the second conductive material is above the water and surrounded by air. The capacitive voltage detection circuit is configured to generate an alert signal in response to a voltage level provided to the electrical input exceeding a threshold voltage of the capacitive voltage detection circuit. The alert signal may, for example, cause at least one sensory alarm to be activated to alert people to the presence of voltage in the water that exceeds the threshold voltage.

Generally, in one aspect, a floating apparatus for alerting people of the presence of voltage in water includes a buoyant housing having a first housing portion and a second housing portion. When the floating apparatus is placed in water with the first housing portion submerged in the water, the buoyant housing is configured to maintain the first housing portion submerged in the water and maintain the second housing portion above the water. The floating apparatus further includes a capacitive voltage detection circuit, a first conductive material, and a second conductive material. The capacitive voltage detection circuit is enclosed within the buoyant housing, has an electrical input, and is configured to generate an alert signal in response to a voltage level provided to the electrical input exceeding a threshold voltage. The floating apparatus further comprises a first conductive material and a second conductive material. The first conductive material is electrically coupled to the electrical input and is at least partially enclosed within the first housing portion. The second conductive material is electrically coupled to the electrical input, is electrically in series with the first conductive materials, and is at least partially enclosed within the second housing portion.

These and other implementations of the technology may include one or more of the following features.

In some implementations, the first conductive material may include a counterweight fully enclosed in the first housing portion. The counterweight contributes to maintaining the first housing portion submerged in the water when the floating apparatus is placed in the water. In some of those implementations, the second conductive material comprises a portion of a conductive wire extending between the counterweight and the electrical input. An exterior surface of the counterweight may optionally be within one fourth of an inch of at least a portion of an interior surface of the first housing portion.

In some implementations, the floating apparatus further includes at least one sensory alarm coupled to the buoyant housing. The sensory alarm is activated in response to the alert signal being generated by the capacitive voltage detection circuit. In some of those implementations, the at least one sensory alarm includes a transducer that produces an audible sound when activated and/or a light source that produces visible light when activated. In some of those implementations, the alert signal comprises switching a switch to an active position, wherein a battery powers the at least one sensory alarm when the switch is in the active position and does not power the at least one sensory alarm when the switch is not in the active position.

In some implementations, the second conductive material comprises a metallic material at least partially surrounding the capacitive voltage detection circuit and fully enclosed in the second housing portion. In some of those implementations, there is no direct contact between the metallic material and the electrical input.

In some implementations, the buoyant housing further comprises a buoyant material portion positioned between the first conductive material and the second conductive material. In some of those implementations, a unitary shaft forms the first housing portion and the second housing portion, the buoyant material portion comprises a buoyant ring surrounding the unitary shaft, and/or the unitary shaft is formed from a buoyant material.

Generally, in another aspect, a floating apparatus for alerting people of the presence of voltage in water includes a buoyant housing having a first housing portion, a second housing portion, and a buoyant material portion. When the floating apparatus is placed in water with the first housing portion submerged in the water, the first housing portion is maintained submerged in the water, the buoyant material portion contacts the water, and the second housing portion is maintained above the water. The floating apparatus further includes a capacitive voltage detection circuit, a first conductive material, and a second conductive material. The capacitive voltage detection circuit is enclosed within the buoyant housing, has an electrical input, and is configured to generate an alert signal in response to a voltage level provided to the electrical input exceeding a threshold voltage. The first conductive material is electrically coupled to the first capacitor reference input and is at least partially enclosed within the first housing portion. The second conductive material is electrically coupled to the electrical input, is electrically in series with the first conductive material, and is at least partially enclosed within the second housing portion.

These and other implementations of the technology may include one or more of the following features.

In some implementations, the first conductive material includes a counterweight fully enclosed in the first housing portion. The counterweight contributes to maintaining the first housing portion submerged in the water when the floating apparatus is placed in the water.

In some implementations, the floating apparatus further includes at least one sensory alarm coupled to the buoyant housing. The sensory alarm is activated in response to the alert signal being generated by the capacitive voltage detection circuit.

In some implementations, the buoyant material portion is at least partially submerged in the water when the floating apparatus is placed in the water.

Generally, in another aspect, a floating apparatus for alerting people of the presence of voltage in water includes a unitary shaft comprising a first portion and a second portion, and a buoyant material portion coupled to the unitary shaft and extending outward from the unitary shaft. When the floating apparatus is placed in water with the first portion submerged in the water, the first portion is maintained submerged in the water, the buoyant material portion contacts the water, and the second portion is maintained above the water. The floating apparatus further includes a non-contact capacitive voltage detection circuit. The non-contact capacitive voltage detection circuit is enclosed within the unitary shaft, is coupled to an antenna, and generates an alert signal in response to a voltage level of the antenna exceeding a threshold voltage. The antenna is at least partially enclosed within the first portion. The second conductive material is electrically coupled in series with the antenna and is at least partially enclosed within the second portion.

Generally, in another aspect, a floating apparatus for alerting people of the presence of voltage in water includes a capacitive voltage detection circuit, a first conductive material, and a second conductive material. The capacitive voltage detection circuit is configured to determine generate an alert signal in response to a voltage level provided to an electrical input of the circuit exceeding a threshold voltage. The first conductive material and the second conductive material are electrically connected in series with one another and are directly electrically coupled to the electrical input of the circuit. The floating apparatus further comprise a buoyant housing that encloses the capacitive voltage detection circuit, the first conductive material, and the second conductive material—and prevents water from infiltrating the buoyant housing and contacting the capacitive voltage detection circuit, the first conductive material, and the second conductive material. When the floating apparatus is placed in water in one or more orientations, the buoyant housing is configured to maintain at least a portion of the second conductive material above water and at least a portion of the first conductive material below water.

These and other implementations of the technology may include one or more of the following features.

In some implementations, the buoyant housing is configured to maintain the entirety of the second conductive material above the water when the floating apparatus is placed in the water in one or more orientations.

In some implementations, the buoyant housing is configured to maintain a majority of the mass of the first conductive material below the water when the floating apparatus is placed in the water in one or more orientations. In some of those implementations, the buoyant housing is configured to maintain at least eighty percent of the mass of the first conductive material below the water when the floating apparatus is placed in the water in one or more orientations.

In some implementations, the buoyant housing is configured to maintain the entirety of the capacitive voltage detection circuit above the water when the floating apparatus is placed in the water in one or more orientations.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Figure 1:
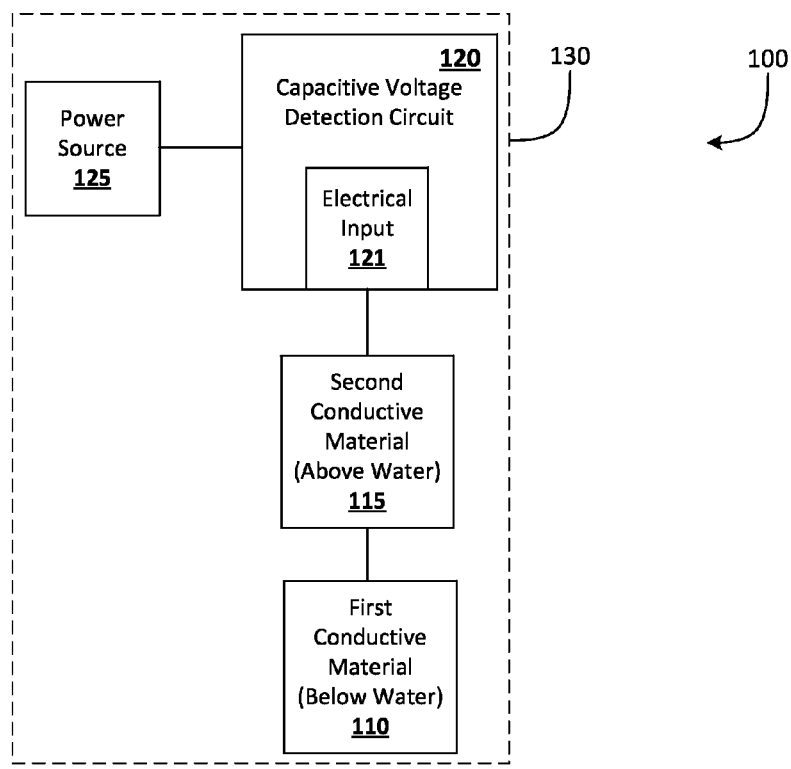
FIG. 1 illustrates a schematic diagram of an example of a floating apparatus for alerting people of the presence of voltage in water.

FIG. 1 illustrates a schematic diagram of an example of a floating apparatus 100 for alerting people of the presence of voltage in water. The floating apparatus 100 of FIG. 1 includes a housing 130 that encloses a first conductive material 110, a second conductive material 115, a capacitive voltage detection circuit 120, and a power source 125. The power source 125 powers the capacitive voltage detection circuit 120 and may include, for example, one or more batteries. In some implementations, the one or more batteries may optionally be periodically charged via a solar panel coupled to the housing 130 and associated circuitry.

When the floating apparatus 100 is placed in water in one or more orientations, the housing 130 is configured to maintain at least a portion of the first conductive material 110 below the water and at least a portion of the second conductive material 115 above the water. In some implementations, the floating apparatus 100 includes one or more structures that contribute to maintaining at least a portion of the first conductive material 110 below the water and at least a portion of the second conductive material 115 above the water (when placed in the water in one or more orientations) and/or that bias the housing to an orientation in which at least a portion of the first conductive material 110 is below the water and at least a portion of the second conductive material 115 is above the water (when placed in the water in one or more orientations, such as any orientation). For example, one or more counterweights may cause the housing 130 to move to an orientation in water in which at least a portion of the first conductive material 110 is below the water and at least a portion of the second conductive material 115 is above the water—regardless of the particular orientation in which the housing 130 is originally placed in the water. The counterweight(s) may, for example, be enclosed in the housing 130 (e.g., the first conductive material 110 may be a counterweight in some implementations), form part of the housing 130, and/or be coupled to an exterior of the housing (e.g., a "sinker" or other weight appended to the housing 130). Also, for example, the housing 130 may comprise one or more buoyant materials to stabilize the floating apparatus 100 such that it maintains at least a portion of the first conductive material 110 below the water and at least a portion of the second conductive material 115 above the water in various water conditions. Additional detail on some examples of counterweight and buoyant material structures is provided below in describing FIGS. 3-7.

The first conductive material 110 and the second conductive material 115 are electrically in series with one another and are coupled to the capacitive voltage detection circuit 120 via the electrical input 121. In some implementations, one or more of the couplings between the first conductive material 110, the second conductive material 115, and the electrical input 121 are direct electrical couplings (e.g., via a wire extending between the conductive materials 110, 115 and the electrical input 121). In some implementations, one or more of the couplings are indirect electrical couplings (e.g., via an electromagnetic field without wires).

Generally, when the floating apparatus 100 is placed in water, the capacitive voltage detection circuit 120 determines, based on the input received via the electrical input 121, a voltage level indicative of a level of voltage that is present in the water. For example, when the first conductive material 110 is at least partially below the water, the first conductive material 110 is electrically coupled to the water and provides input to the first input 121 that is indicative of the level of voltage (if any) that is present in the water. The first conductive material 110 and the water are separated by a dielectric such as the housing 130 and/or air between the first conductive material 110 and the housing 130, and the first conductive material 110 and the water functionally form a capacitor. Accordingly, when voltage is present in the water, an electric charge will accumulate at the first conductive material 110 and the electric charge provided to the electrical input 121. When the second conductive material 115 is at least partially above the water, the second conductive material 115 is electrically coupled to the air above the water. The second conductive material 115 and the air are separated by a dielectric such as the housing 130 and/or air between the second conductive material 115 and the housing 130, and the second conductive material 115 and the air also functionally form a capacitor.

As described above, the first conductive material 110 and the second conductive material 115 are electrically in series with one another and each functionally form part of a respective capacitor. When the first conductive material 110 is at least partially below the water, the capacitor formed between the first conductive material 110 and the water will be of a smaller capacitance than that of the capacitor formed between the second conductive material 115 and the air. Accordingly, when the first conductive material 110 is at least partially below the water and the water has voltage, an electric charge will accumulate at the first conductive material 110 and the electric charge provided to the electrical input 121. In many implementations, the voltage level provided to the electrical input 121 will be proportional to the voltage level of the water, but will be an order of magnitude less than the voltage of the water (e.g., based on design considerations of the floating apparatus 100).

The capacitive voltage detection circuit 120 generates an alert signal when the voltage level provided to the electrical input 121 exceeds a threshold voltage. In some implementations, the alert signal is a signal that causes one or more sensory alarms to be activated such as a visual alarm (e.g., a light emitting diode or other light source) or an audible alarm (e.g., a transducer that transmits a high pitched sound when activated). The sensory alarm(s) may form part of the floating apparatus 100 and/or may be located remote from the floating apparatus 100. The alert signal may be, for example, actuating a switch to cause power to be supplied to the sensory alarm(s) and the sensory alarm(s) resultantly activated—and/or a radio frequency (RF) or hard-wired signal that causes the sensory alarm(s) to be activated (e.g., an RF signal sent to a remote sensory alarm).

Figure 2:
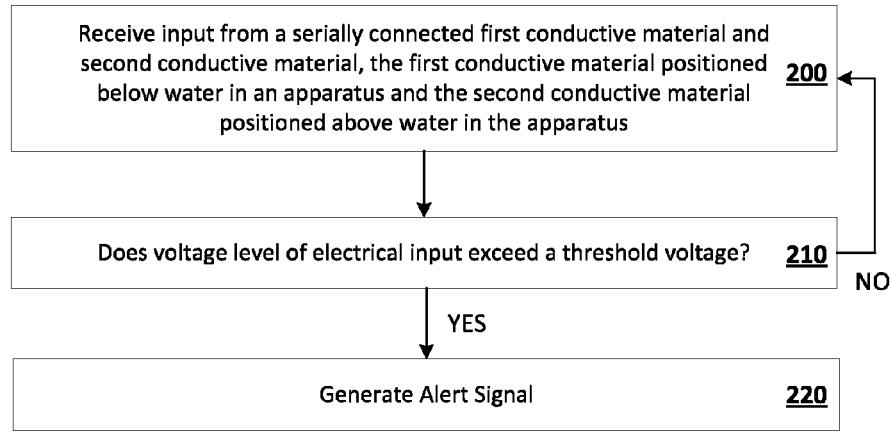
FIG. 2 illustrates an example method of generating an alert signal in response to determining, based on electrical input of a first conductive material below water and a second conductive material above the water, that a voltage level exceeds a threshold voltage.

Turning to FIG. 2, a flow chart is illustrated of an example method of generating an alert signal in response to determining, based on electrical input of a first conductive material below water and a second conductive material above the water, that a voltage level exceeds a threshold voltage. Other implementations may perform the steps in a different order, omit certain steps, and/or perform different and/or additional steps than those illustrated in FIG. 2. FIG. 2 will be described with reference to a voltage detection circuit that perform the process. The voltage detection circuit may be, for example, the capacitive voltage detection circuits 120 and/or 320 illustrated in the Figures.

At step 200, input is received from a serially connected first conductive material and second conductive material. The first conductive material is positioned below water in an apparatus and the second conductive material is positioned above water in the apparatus. For example, the electrical input 121 of capacitive voltage detection circuit 120 may receive input from the first conductive material 110 when it is positioned at least partially below water in the housing 130 and from the second conductive material 115 when it is positioned at least partially above the water in the housing 130. As described herein, the first conductive material 110 and the water may functionally form a capacitor and the second conductive material 115 and the air may also functionally form a capacitor.

At step 210, it is determined whether the voltage level of the electrical input exceeds a threshold voltage. If so, then the method proceeds to step 220. If not, then the method returns to step 200. For example, an integrated circuit and/or one or more discrete components (e.g., a field-effect transistor (FET)) of the capacitive voltage detection circuit 120 may determine if the voltage level exceeds a threshold voltage of the capacitive voltage detection circuit 120. For instance, a field-effect transistor (e.g., a junction gate field-effect transistor (JFET) or a metal-oxide-semiconductor field-effect transistor (MOSFET)) of the capacitive voltage detection circuit 120 may be electrically coupled to the electrical input 121 and may have first properties when the voltage level of the electrical input 121 does not exceed a threshold voltage of the FET and may have second properties when the voltage level of the electrical input 121 exceeds the threshold voltage of the FET.

The threshold voltage is greater than zero and may be set in view of manufacturing preference, end user preference (e.g., via a dip switch or other user interface element), the sensitivity of the capacitive voltage detection circuit 120 (e.g., the threshold voltage of a FET), safety concerns, maintaining a balance between safety concerns and the minimization of false positives, and/or other factors. In some implementations, the threshold voltage may be a voltage between approximately 0.3V to 10 Volts. As will be understood by one of ordinary skill in the art having had the benefit of the present disclosure, the threshold voltage of step 210 may be an order of magnitude less than a voltage level of water for which it is desirable to proceed to step 220. In other words, the voltage level of the water for which it is desirable to proceed to step 220 may not be fully transferred to the electrical input at step 200—rather the voltage received at step 200 is less than, but proportional to, the voltage level of the water. For example, the voltage level of the water that may lead to the voltage level of the electrical input exceeding a threshold voltage of 0.6V may be approximately 10 Volts, 24 Volts, 48 Volts, and/or other desired voltage.

At step 220, an alert signal is generated if the voltage differential exceeds the threshold voltage at step 210. The alert signal is a signal that causes one or more sensory alarms to be activated. The alert signal may be, for example, actuating a switch to cause power to be supplied to the sensory alarm(s) and the sensory alarm(s) resultantly activated—and/or a radio frequency (RF) or hard-wired signal that causes the sensory alarm(s) to be activated. For instance, a FET of the capacitive voltage detection circuit may have second properties when the voltage level of the electrical input 121 exceeds the threshold voltage of the FET and when it has those second properties may cause voltage to be supplied to the sensory alarm(s) (or voltage to be supplied to a switch to thereby cause power to be supplied to the sensory alarm(s)).

Figure 3:
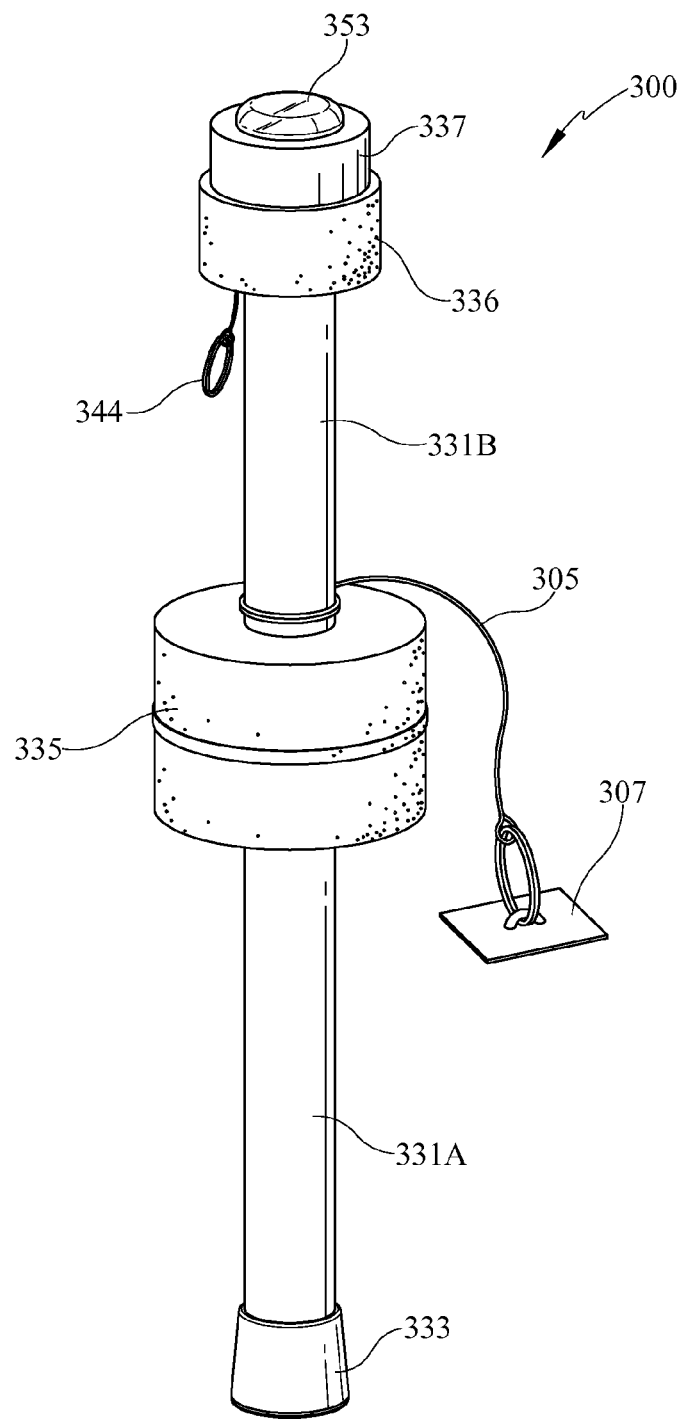
FIG. 3 illustrates a perspective view of another example of a floating apparatus for alerting people of the presence of voltage in water.
Figure 4:
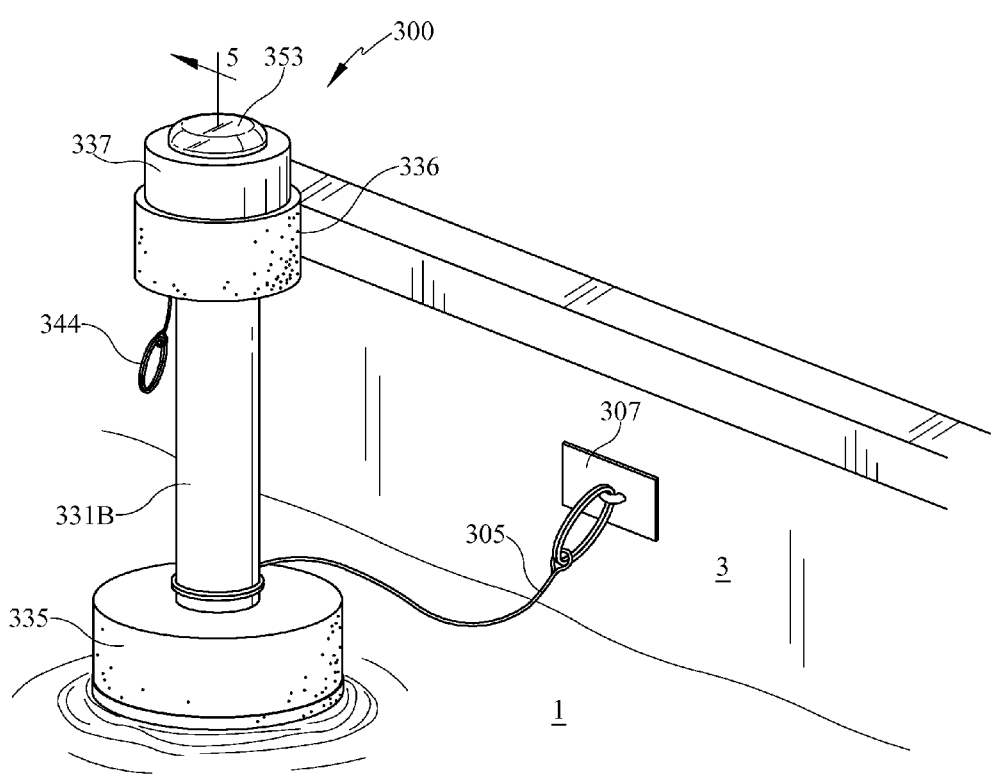
FIG. 4 illustrates the floating apparatus of FIG. 3 placed in water and tethered to a surface that is adjacent the water.
Figure 4:
Figure 5:
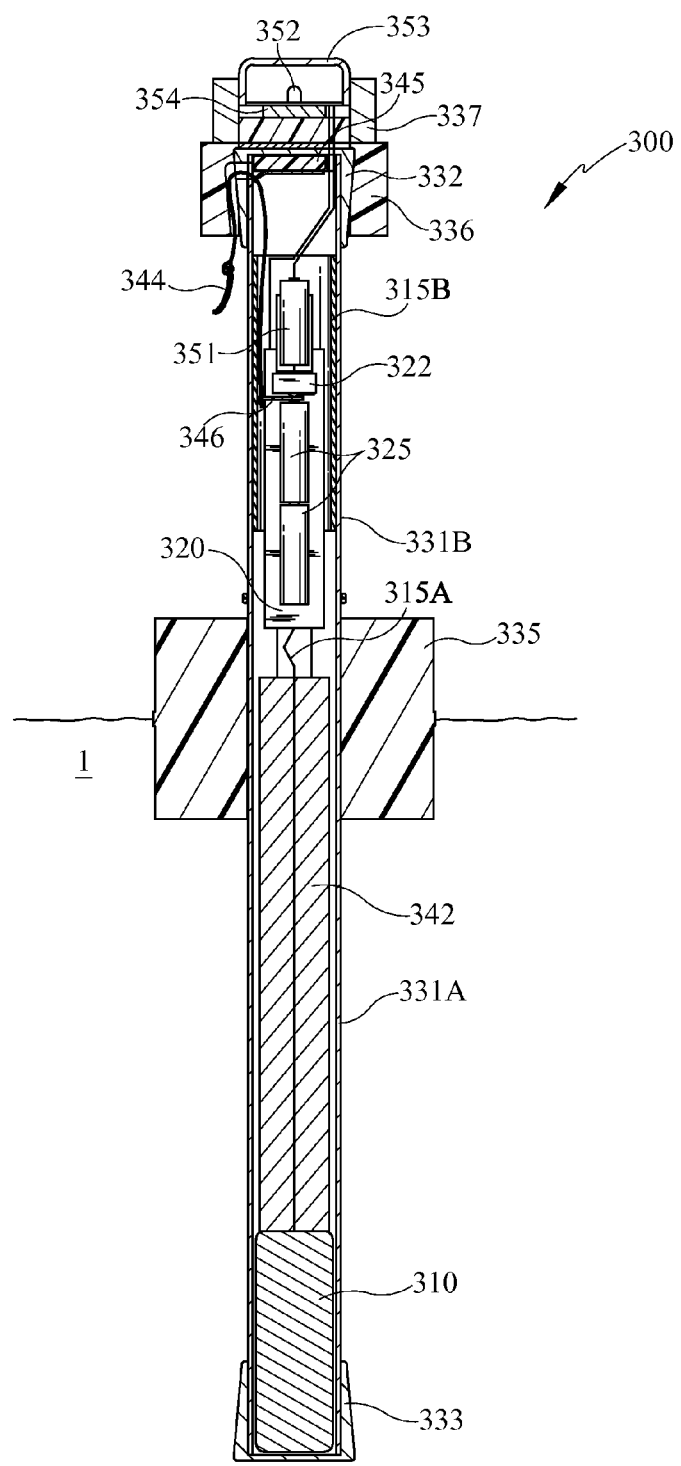
FIG. 5 illustrates a section view of the floating apparatus placed in water of FIG. 4, taken along the section line 5-5 of FIG. 4.

With reference to FIGS. 3-5, another example of a floating apparatus 300 for alerting people of the presence of voltage in water is illustrated. FIG. 3 illustrates a perspective view of the floating apparatus 300, FIG. 4 illustrates the floating apparatus 300 placed in water 1 and tethered to a vertical surface 3 that is adjacent the water 1, and FIG. 5 illustrates a section view of the floating apparatus 300 taken along the section line 5-5 of FIG. 4.

The floating apparatus 300 has a buoyant housing that includes a first housing portion 331A and a second housing portion 331B. In the example of FIGS. 3-5, a unitary cylindrical shaft forms the first housing portion 331A and second housing portion 331B. In other implementations, the first and second housing portions may take on other shapes (e.g., a triangular, square, or polygonal shaft), may not form a unitary structure (e.g., two separate shafts or other structures joined by an intermediary wire, shaft, or other structure), and/or may otherwise vary from the example illustrated in FIGS. 3-5. When the floating apparatus 300 is placed in stable water and is in a stabilized condition, the first housing portion 331A is the portion that is submerged in the water and the second housing portion 331B is the portion that is above the water. For example, in FIG. 5 the first housing portion 331A is the portion that is below the surface of the water 1 and the second housing portion 331B is the portion that is above the surface of the water 1. In some implementations, the unitary cylindrical shaft that forms the first housing portion 331A and second housing portion 331B may be formed from a dielectric material such as a thermoplastic material. For example, the unitary cylindrical shaft may be polyethylene, such as a schedule twenty polyethylene pipe cut to a desired length, such as sixteen inches.

The buoyant housing of the floating apparatus 300 also includes a buoyant ring 335 that surrounds the unitary cylindrical shaft that forms the first housing portion 331A and second housing portion 331B. The buoyant ring 335 is constructed from a buoyant material such as a plastic foam (e.g., polyethylene and/or polyurethane) and is positioned along the unitary cylindrical shaft to assist in maintaining the first housing portion 331A above water when the floating apparatus 300 is placed in the water. Moreover, the buoyant ring 335 may lessen (relative to if the buoyant ring 335 was omitted from the floating apparatus 300) the degree to which the vertical position (i.e., "up" and "down" in the water) and orientation of the floating apparatus 300 in the water are altered in response to contact with waves, contact with humans, etc.

The buoyant housing of the floating apparatus 300 also includes end caps 332 and 333 that are placed over opposed open ends of the unitary cylindrical shaft that forms the first housing portion 331A and the second housing portion 331B. The end caps 332 and 333 may be in friction fit and/or adhered (e.g., with a waterproof adhesive) to the unitary cylindrical shaft and may assist in preventing water intrusion into the interior of the housing. The buoyant housing of the floating apparatus 300 further includes a grommet 336 placed over the end cap 332. The grommet 336 may be made from rubber or other elastic material and may assist in preventing water intrusion into the interior of the housing and/or to the light emitting diode (LED) 352, transducer 354, and/or wires or other components associated with the LED 352 and/or transducer 354.

A capacitive voltage detection circuit 320 is enclosed within the housing. The capacitive voltage detection circuit 320 may be configured to detect that a threshold level of voltage is present near an area of measurement without requiring that a ground wire be connected between the capacitive voltage detection circuit 320 and a fixed structure remote from the floating apparatus 300 such as soil. The capacitive voltage detection circuit 320 may include an integrated circuit and/or discrete components to determine a level of voltage at an input thereof. For example, the capacitive voltage detection circuit 320 may perform one or more steps of the method of FIG. 2 to determine if a level of voltage satisfies a threshold voltage. In some implementations, the capacitive voltage detection circuit 320 may comprise, or share one or more similarities with, voltage detection circuits of capacitive voltage detectors known as "non-contact voltage detectors" and "capacitive voltage detectors". One non-limiting example of such a capacitive voltage sensor is the "2AC VOLTALERT" voltage detector manufactured by the FLUKE Corporation.

The depicted capacitive voltage detection circuit 320 is provided on a circuit board and the circuit board is in a substantially fixed position within the housing. The circuit board may be positioned within the housing using brackets, adhesives, structure that confines the circuit board to a space, and/or other means. As illustrated in FIG. 5, the circuit board is arranged parallel with a longitudinal axis of the unitary cylindrical shaft that forms the first housing portion 331A and the second housing portion 331B, and the circuit board is perpendicular to the surface of the water 1 when the floating apparatus 300 is in a stable orientation (e.g., as illustrated in FIG. 5). The circuit board also includes receptacles for receiving two batteries 325 and the receptacles are electrically connected to the capacitive voltage detection circuit 320. The batteries 325 provide power, via the receptacles, to the capacitive voltage detection circuit 320. In some implementations, the capacitive voltage detection circuit 320 may be configured to use power from the batteries 325 (or use a greater extent of power from the batteries) only when at least some voltage is detected at an electrical input thereof. For example, the voltage detection circuit 320 may incorporate voltage sense circuitry at its electrical input that, when it senses at least some voltage, activates a switch to cause the batteries 325 to provide power to the capacitive voltage detection circuit 320.

In FIG. 5, a pull tab 346 is illustrated interposed between one of the two batteries 325 and one of the receptacles for the batteries, thereby preventing the capacitive voltage detection circuit 320 from being active (and the batteries 325 from being drained). The pull tab 346 is connected to a pull ring 344 via a string. A user may pull the pull ring 344 to permanently remove the pull tab 346 from being interposed between one of the two batteries 325 and one of the receptacles for the batteries, thereby activating the capacitive voltage detection circuit 320. This may prevent the floating apparatus 300 from being active until the pull ring 344 is pulled by the user—thereby preventing premature drainage of the batteries 325 before the floating apparatus is intended to be used by the user. Moreover, this may prevent the floating apparatus 300 from being deactivated once the pull ring 344 is pulled by the user—thereby ensuring the floating apparatus 300 remains in an active state (monitoring for presence of voltage in water) once the pull ring 344 is pulled by the user—thereby preventing the floating apparatus 300 from being turned off and left in the water (which may provide a false sense of safety to people viewing the floating apparatus 300).

In FIG. 5, the string between the pull ring 344 and the pull tab 346 is also illustrated coupled to a pull ring of an expansion foam capsule 345. When the user pulls the pull ring 344, the pull ring of the expansion foam capsule may also be pulled, thereby causing an expansion foam to be emitted from the expansion foam capsule 345. The expansion foam may expand (when emitted from the expansion foam capsule 345) within the unitary cylindrical shaft to provide further resistance against water intrusion (e.g., intrusion through opening(s) for the string coupled to the pull ring 344 and/or intrusion through the opening capped by the end cap 332). In some implementations, the expansion foam capsule 345 may be omitted or replaced with other structure such as a grommet sealed around the string. Also, in some implementations the pull tab 346 and pull ring may be omitted or replaced with other structure such as an on/off switch.

The capacitive voltage detection circuit 320 has an electrical input that is directly electrically coupled to a conductive wire 315A that is directly electrically coupled to a conductive counterweight 310. The conductive wire 315A extends through a spacer 342 that maintains the conductive counterweight 310 in position within the housing. In other implementations, alternative structure may be utilized to maintain the conductive counterweight 310 in position such as an internal rib within the housing and/or adhesive. In some implementations, the portion of the conductive wire 315A that is positioned between the capacitive voltage detection circuit 320 and the spacer 342 may be an antenna of a non-contact voltage detection circuit and/or may be at least partially encapsulated by a dielectric material. In some of those implementations, the portion of the conductive wire 315A that is positioned between the capacitive voltage detection circuit 320 and the spacer 342 may be coupled (e.g., soldered or "twisted") serially to the portion of the conductive wire 315A that extends through the spacer 342 to the conductive counterweight 310.

The conductive counterweight 310 may have a weight that biases the floating apparatus to be maintained in a position such as that illustrated in FIG. 5. For example, the counterweight may contribute to maintaining certain components of the floating apparatus 300 below the water. Also, for example, when waves, humans, and/or other forces contact the floating apparatus 300 and displace the vertical position and/or orientation of the floating apparatus 300, the weight of the conductive counterweight 310 may assist in biasing the floating apparatus 300 toward the vertical position and/or orientation illustrated in FIG. 5. In some implementations, the weight of the conductive counterweight 310 may be sufficient to "self-correct" the floating apparatus 300 to a vertical position and orientation where certain components of the floating apparatus 300 are below the water and other components are above the water—regardless of the orientation at which the floating apparatus 300 is placed in the water (or displaced once in the water).

When the conductive counterweight 310 is below the water 1 as illustrated in FIG. 5, the conductive counterweight 310 is electrically coupled to the water and provides input to the capacitive voltage detection circuit 320 (via conductive wire 315A) that is indicative of the level of voltage (if any) that is present in the water. The conductive counterweight 310 and the water 1 are separated by the second housing portion 331B and an optional air gap between the second housing portion 331B and the conductive counterweight 310. Accordingly, the conductive counterweight 310 and the water 1 functionally form a capacitor. When voltage is present in the water 1, an electric charge will accumulate at the conductive counterweight 310 and the electric charge provided, via conductive wire 315A, to the capacitive voltage detection circuit 320.

In some implementations, at least portions of an exterior surface of the conductive counterweight 310 may be within a half inch of an interior surface of the first housing portion 331A and/or a distance between an interior surface of the first housing portion 331A and an exterior surface of the first housing portion 331A may be less than a half inch. For example, all or portions of the peripheral exterior surface of the conductive counterweight 310 may be within one fourth of an inch of an interior surface of the first housing portion 331A and the distance between an interior surface of the first housing portion 331A and an exterior surface of the first housing portion 331A may be approximately one fourth of an inch. These and/or other configurations of the conductive counterweight 310 and/or the second housing portion 331B may result in a distance between the conductive counterweight 310 and the water 1 that provides desired electromagnetic coupling between the water 1 and the conductive counterweight 310.

As illustrated in FIG. 5, a portion of the conductive wire 315A is above water. When that portion of the conductive wire 315A is above the water 1 as illustrated in FIG. 5, it is electromagnetically coupled to air above the water 1 and that portion and the air functionally form a capacitor that is in series with the capacitor formed by the conductive counterweight 310 and the water 1. Also illustrated in FIG. 5 is a conductive sheet of material 315B that is provided peripherally of at least a portion of the capacitive voltage detection circuit 320. In some implementations, the conductive sheet of material 315B is adhered to or otherwise affixed (e.g., friction fit) to the interior surface of a portion of the second housing portion 331B and at least partially surrounds at least a portion of the capacitive voltage detection circuit 320. The conductive sheet of material 315B may be, for example, a sheet of aluminum and/or other metallic material (including metals and metal alloys). When the conductive sheet of material 315B is above the water 1 as illustrated in FIG. 5, the conductive sheet of material 315B is electrically coupled to the air above the water and is also electromagnetically connected in series with the conductive wire 315A. In some implementations, the conductive sheet of material 315B may be omitted.

As described herein, the capacitive voltage detection circuit 320 generates an alert signal when it determines a voltage level provided to its electrical input (e.g., via conductive wire 315A) exceeds a threshold voltage. In the example of FIGS. 3-5, the alert signal generated by the capacitive voltage detection circuit 320 is the switching of a switch 322 (FIG. 5) to an active position. When the switch 322 is in the active position, it closes a circuit that causes an alarm battery 351 to power a transducer 354 and an LED 352. The alarm battery 351 does not power the transducer and the LED 352 when the switch is not in the active position.

When the alarm battery 351 provides power to the transducer 354, the transducer 354 produces an audible sound such as a high pitched alarm sound to alert people of the presence of voltage in water. When the alarm battery 351 provides power to the LED 352, the LED 352 produces visible light (the produced light may visually appear "continuous" or may "blink") to alert people to the presence of voltage in water. The LED 352 may emit red light in some implementations, and/or the lens 353 provided over the LED 352 may be colored to alter light emitted by the LED 352 so that it appears red to people viewing the altered light emitted by the lens 353. Other LED colors and/or lens colors may be utilized. A grommet 337 surrounds a portion of the lens 353, the LED 352, and the transducer 354 and is coupled to the end cap 332. The grommet 337 may be made from rubber or other elastic material and may assist in preventing water intrusion to the LED 352, transducer 354, and/or wires or other components associated with the LED 352 and/or transducer 354.

The position of the LED 352 and/or transducer 354 may be adjusted in one or more implementations. For example, the transducer 354 may be enclosed in the second housing portion 331B in some implementations. Also, in some implementations the LED 352 (or other light source) may be provided without providing the transducer 354, or vice versa. Also, in some implementations one or more sensory alarms, such as a transducer and/or LED, may be provided remote from the floating apparatus 300 (with or without sensory alarms also being provided on the floating apparatus 300). For example, the floating apparatus 300 may include an RF transmitter and the alert signal generated by the capacitive voltage detection circuit may be activation of the RF transmitter to transmit a certain frequency and/or encoded signal that is detected by an RF receiver to cause a remote sensory alarm to be activated.

FIGS. 3 and 4 illustrate a harness strap 305 that may be wrapped around or otherwise coupled to the floating apparatus 300. The harness strap 305 is also coupled to a fastener 307. As illustrated in FIG. 4, the fastener 307 may be coupled to a surface, such as vertical surface 3, to maintain the floating apparatus 300 in a desired area within the water 1. This may be desirable to, for example, prevent the floating apparatus 300 from floating away in a large body of water such as a lake and/or to maintain the floating apparatus 300 in a lower traffic area of a pool.

Figure 6:
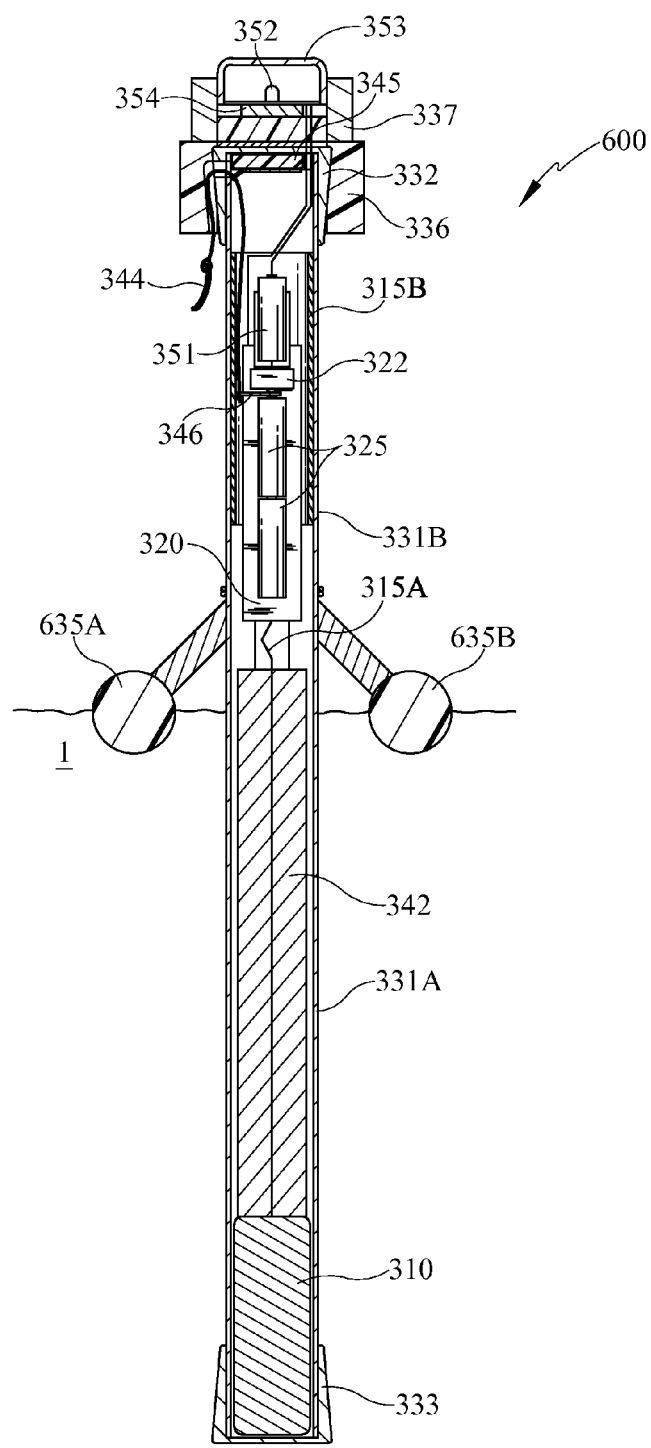
FIG. 6 illustrates a section view of another example of a floating apparatus for alerting people of the presence of voltage in water.
Figure 7:
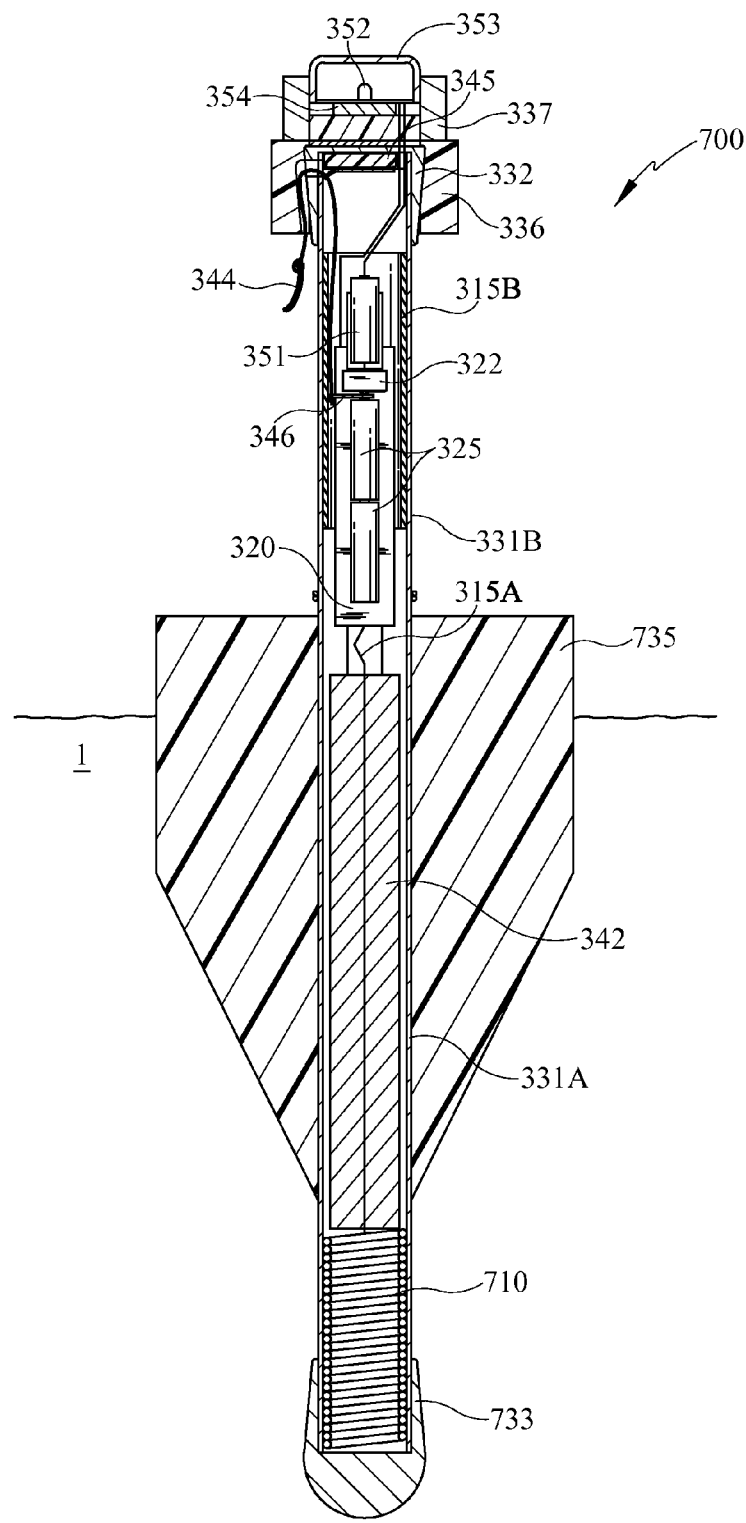
FIG. 7 illustrates a section view of another example of a floating apparatus for alerting people of the presence of voltage in water.

FIG. 6 illustrates a section view of another floating apparatus 600 for alerting people of the presence of voltage in water and FIG. 7 illustrates a section view of yet another floating apparatus 700 for alerting people of the presence of voltage in water. In the examples illustrated in FIGS. 6 and 7, many of the components are the same as those illustrated and described with respect to the floating apparatus 300. Accordingly, the same numbering is provided for those components and description of those components with respect to FIGS. 6 and 7 is omitted for the sake of brevity.

The floating apparatus 600 of FIG. 6 has a buoyant housing that includes a first buoyant member 635A and a second buoyant member 635B in lieu of the buoyant ring 335 of FIGS. 3-5. Each of the buoyant members 635A, 635B is longitudinally extending (e.g., extend into and out of the sheet of FIG. 6) and constructed from a buoyant material such as a plastic foam. The buoyant members 635A and 635B function as dual hulls and are positioned to assist in maintaining the first housing portion 331A above water when the floating apparatus 600 is placed in the water. Moreover, the buoyant members 635A and 635B may lessen (relative to if the buoyant members 635A and 635B were omitted from the floating apparatus 600) the degree to which the vertical position (i.e., "up" and "down" in the water) and orientation of the floating apparatus 600 in the water are altered in response to contact with waves, contact with humans, etc.

The floating apparatus 700 of FIG. 7 has a buoyant housing that includes a single hull type buoyant member 735 in lieu of the buoyant ring 335 of FIGS. 3-5. The single hull type buoyant member 735 is configured and positioned to assist in maintaining the first housing portion 331A above water when the floating apparatus 700 is placed in the water. Moreover, the single hull type buoyant member 735 may lessen (relative to if the single hull type buoyant member 735 were omitted from the floating apparatus 700) the degree to which the vertical position (i.e., "up" and "down" in the water) and orientation of the floating apparatus 700 in the water are altered in response to contact with waves, contact with humans, etc.

The floating apparatus 700 of FIG. 7 also has an unsheathed conductive wire coil 710 that is directly electrically coupled to the conductive wire 315A in lieu of the conductive counterweight 310 of FIGS. 3-5. The conductive wire coil 710 is positioned close (e.g., contacting or within a half inch) to the interior surface of the first housing portion 331A. When the conductive wire coil 710 is below the water 1 as illustrated in FIG. 7, the wire coil 710 is electrically coupled to the water 1 and provides input to the capacitive voltage detection circuit 320 (via conductive wire 315A) that is indicative of the level of voltage (if any) that is present in the water 1.

The floating apparatus 700 of FIG. 7 also has a weighted endcap 733 that is provided in lieu of the endcap 333 of FIGS. 3-5. The weighted endcap 733 may include a quantity and/or density of material that weights the weighted endcap 733 so that it biases the floating apparatus 700 to be maintained in a position such as that illustrated in FIG. 7. For example, the weighted endcap 733 may contribute to maintaining certain components of the floating apparatus 700 below the water and/or assist in biasing the floating apparatus 700 toward the vertical position and/or orientation illustrated in FIG. 7 when forces contact the floating apparatus 700 and displace the vertical position and/or orientation of the floating apparatus 700. In some implementations of the floating apparatus 700, the end cap 333 may be used in lieu of the weighted endcap 733.

Although FIGS. 6 and 7 illustrate specific variations that may be made to the floating apparatus 300 of FIGS. 3-5, one of ordinary skill in the art, having had the benefit of the present disclosure, will recognize and appreciate that additional and/or alternative variations may be made. For example, multiple spherical buoyant nodes may be positioned in a "spider like" configuration and utilized in lieu of the buoyant material portions illustrated in FIGS. 3-7. Also, for example, different shapes and configurations of the first housing portion and/or second housing portion may be utilized. Also, for example, components of FIGS. 3-5, 6, and/or 7 may be interchanged with similar components of others of FIGS. 3-5, 6, and/or 7.

While several implementations have been described and illustrated herein, a variety of other means and/or structures for performing the function and/or obtaining the results and/or one or more of the advantages described herein may be utilized, and each of such variations and/or modifications is deemed to be within the scope of the implementations described herein. More generally, all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific implementations described herein. It is, therefore, to be understood that the foregoing implementations are presented by way of example only and that, within the scope of the appended claims and equivalents thereto, implementations may be practiced otherwise than as specifically described and claimed. Implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The invention claimed is:

1. A floating apparatus for alerting people of the presence of voltage in water, comprising:
    a buoyant housing comprising a first housing portion and a second housing portion;
    wherein, when the floating apparatus is placed in water with the first housing portion submerged in the water, the buoyant housing is configured to maintain the first housing portion submerged in the water and maintain the second housing portion above the water;
    a capacitive voltage detection circuit enclosed within the buoyant housing, the capacitive voltage detection circuit having an electrical input and configured to generate an alert signal in response to a voltage level provided to the electrical input exceeding a threshold voltage;
    a first conductive material electrically coupled to the electrical input, the first conductive material at least partially enclosed within the first housing portion; and
    a second conductive material electrically coupled to the electrical input and electrically in series with the first conductive material, the second conductive material at least partially enclosed within the second housing portion.

2. The floating apparatus of claim 1, wherein the first conductive material comprises a counterweight fully enclosed in the first housing portion, wherein the counterweight contributes to maintaining the first housing portion submerged in the water when the floating apparatus is placed in the water.

3. The floating apparatus of claim 2, wherein the second conductive material comprises a portion of a conductive wire extending between the counterweight and the electrical input.

4. The floating apparatus of claim 2, wherein an exterior surface of the counterweight is within one fourth of an inch of at least a portion of an interior surface of the first housing portion.

5. The floating apparatus of claim 1, further comprising:
    at least one sensory alarm coupled to the buoyant housing, wherein the sensory alarm is activated in response to the alert signal being generated by the capacitive voltage detection circuit.

6. The floating apparatus of claim 5, wherein the at least one sensory alarm comprises at least one of:
    a transducer that produces an audible sound when activated, and
    a light source that produces visible light when activated.

7. The floating apparatus of claim 5, wherein the alert signal comprises switching a switch to an active position, wherein a battery powers the at least one sensory alarm when the switch is in the active position and does not power the at least one sensory alarm when the switch is not in the active position.

8. The floating apparatus of claim 1, wherein the second conductive material comprises a metallic material at least partially surrounding the capacitive voltage detection circuit and fully enclosed in the second housing portion.

9. The floating apparatus of claim 8, wherein there is no direct contact between the metallic material and the electrical input.

10. The floating apparatus of claim 1, wherein the buoyant housing further comprises a buoyant material portion positioned between the first conductive material and the second conductive material.

11. The floating apparatus of claim 10, wherein a unitary shaft forms the first housing portion and the second housing portion.

12. The floating apparatus of claim 11, wherein the buoyant material portion comprises a buoyant ring surrounding the unitary shaft.

13. The floating apparatus of claim 12, wherein the unitary shaft is formed from a buoyant material.

14. A floating apparatus for alerting people of the presence of voltage in water, comprising:
    a buoyant housing comprising a first housing portion, a second housing portion, and a buoyant material portion;
    wherein, when the floating apparatus is placed in water with the first housing portion submerged in the water, the first housing portion is maintained submerged in the water, the buoyant material portion contacts the water, and the second housing portion is maintained above the water;
    a capacitive voltage detection circuit enclosed within the buoyant housing, the capacitive voltage detection circuit having an electrical input and configured to generate an alert signal in response to a voltage level provided to the electrical input exceeding a threshold voltage;

a first conductive material electrically coupled to the electrical input, the first conductive material at least partially enclosed within the first housing portion;

a second conductive material electrically coupled to the electrical input and electrically in series with the first conductive material, the second conductive material at least partially enclosed within the second housing portion.

15. The floating apparatus of claim 14, wherein the first conductive material comprises a counterweight fully enclosed in the first housing portion, wherein the counterweight contributes to maintaining the first housing portion submerged in the water when the floating apparatus is placed in the water.

16. The floating apparatus of claim 14, further comprising:

at least one sensory alarm coupled to the buoyant housing, wherein the sensory alarm is activated in response to the alert signal being generated by the capacitive voltage detection circuit.

17. The floating apparatus of claim 16, wherein the at least one sensory alarm comprises:

a transducer that produces an audible sound when activated, and a light source that produces visible light when activated.

18. The floating apparatus of claim 14, wherein the second conductive material comprises a portion of a conductive wire extending between the counterweight and the electrical input.

19. The floating apparatus of claim 14, wherein the buoyant material portion is at least partially submerged in the water when the floating apparatus is placed in the water.

20. A floating apparatus for alerting people of the presence of voltage in water, comprising:

a unitary shaft comprising a first portion and a second portion;

a buoyant material portion coupled to the unitary shaft and extending outward from the unitary shaft;

wherein, when the floating apparatus is placed in water with the first portion submerged in the water, the first portion is maintained submerged in the water, the buoyant material portion contacts the water, and the second portion is maintained above the water;

a non-contact capacitive voltage detection circuit enclosed within the unitary shaft, the non-contact capacitive voltage detection circuit coupled to an antenna and generating an alert signal in response to a voltage level of the antenna exceeding a threshold voltage;

wherein the antenna is at least partially enclosed within the first portion; and a second conductive material directly electrically coupled in series with the antenna, the second conductive material at least partially enclosed within the second portion.

* * * * *